United States Patent
Fong

(10) Patent No.: US 7,564,104 B2
(45) Date of Patent: *Jul. 21, 2009

(54) LOW OHMIC LAYOUT TECHNIQUE FOR MOS TRANSISTORS

(75) Inventor: Victor Fong, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/003,579

(22) Filed: Dec. 28, 2007

(65) Prior Publication Data

US 2008/0105928 A1    May 8, 2008

Related U.S. Application Data

(60) Continuation of application No. 11/504,704, filed on Aug. 16, 2006, now Pat. No. 7,326,618, which is a division of application No. 10/840,602, filed on May 7, 2004, now Pat. No. 7,112,855.

(51) Int. Cl.
*H01L 27/088* (2006.01)
(52) U.S. Cl. .................................................. 257/382
(58) Field of Classification Search ......... 257/382–385, 257/E29.116, E23.012; 438/280
See application file for complete search history.

(56) References Cited

U.S. PATENT DOCUMENTS

| | | | |
|---|---|---|---|
| 5,838,615 A | 11/1998 | Kamiya et al. | |
| 5,844,281 A | 12/1998 | Narita | |
| 5,955,781 A | 9/1999 | Joshi et al. | |
| 6,288,430 B1 * | 9/2001 | Oda | 257/382 |
| 6,351,016 B1 * | 2/2002 | Huang et al. | 257/382 |
| 6,444,520 B1 | 9/2002 | Dennison et al. | |
| 6,512,263 B1 | 1/2003 | Yuan et al. | |
| 6,657,265 B2 | 12/2003 | Fujisawa et al. | |
| 6,690,038 B1 | 2/2004 | Cho et al. | |
| 6,927,457 B2 | 8/2005 | Huang et al. | |
| 6,953,964 B2 | 10/2005 | Yuan et al. | |
| 7,091,585 B2 | 8/2006 | Sun et al. | |
| 7,112,855 B2 | 9/2006 | Fong | |
| 2005/0285148 A1 | 12/2005 | Chen et al. | |
| 2006/0275993 A1 | 12/2006 | Fong | |

* cited by examiner

*Primary Examiner*—Nathan W Ha
(74) *Attorney, Agent, or Firm*—Sterne, Kessler, Goldstein & Fox P.L.L.C.

(57) ABSTRACT

A transistor driver circuit with a plurality of transistors, each having source and drain regions formed in a substrate. At least first and second interconnect layers are formed on top of the substrate. A first plurality of contacts connect the source regions to one of the first or second interconnect layers. A second plurality of contacts connect the drain regions to the other of the first or second interconnect layers. The first and second interconnect layers cover a region above the substrate area in which the plurality of transistors reside so as to achieve a low ohmic result. The second interconnect layer has openings therein for one of the respective first or second plurality of contacts to pass therethrough and couple to the at least one first interconnect layer. Either the first or second interconnect layers can function as an input or output for the circuit.

12 Claims, 6 Drawing Sheets

LOW OHMIC LAYOUT TECHNIQUE FOR MOS TRANSISTORS

CROSS REFERENCE TO RELATED APPLICATIONS

This application is a continuation of U.S. application Ser. No. 11/504,704, filed Aug. 16, 2006, which is a divisional of U.S. application Ser. No. 10/840,602 (now U.S. Pat. No. 7,112,855), all of which are incorporated by reference herein in there entirety.

BACKGROUND OF THE INVENTION

1. Field of the Invention

The invention relates to semiconductor integrated circuit devices, and more particularly to a method of making large area transistors.

2. Related Art

A die (also called chip) is a small piece of silicon wafer, bounded by adjacent scribe lines in the horizontal and vertical directions, that contains the complete device being manufactured. An integrated circuit (also called an IC) comprises many interconnected circuit elements on a single die. Such interconnected circuit elements typically include semiconductor devices, such as transistors or diodes, and other devices, such as capacitors, resistors, and the like. Interconnects (also called wiring) are highly conductive material, usually aluminum, polycrystalline silicon (polysilicon), copper, or the like, that carry electrical signals to different parts of a die.

Signals generated on chip must be sent off chip in order to be coupled to other IC's or components. A common type of transistor used in IC's is a metal-oxide-silicon (MOS) field effect transistor (FET). Complementary metal-oxide-silicon (CMOS) transistor technology includes both p-type and n-type conductivity MOS transistors. Because today's IC's comprise millions of transistors, any one transistor is too small to output sufficient current to "drive" an off-chip (i.e., some other off-chip IC or component) or on-chip load.

So called "large driver" transistors comprise many MOS transistors connected together to provide sufficient output current to drive an off-chip or on-chip load. These drivers usually carry large current. Of course, larger current (I) means a larger voltage(V) drop (i.e., V=I*R; where R=resistance), and more power(P) dissipation (i.e., $P=I^2*R$) across devices and/or interconnects. Larger voltage drop means smaller voltage swing available at the output. More power dissipation means lower efficiency as more power is lost due to heat, etc. Accordingly, larger voltage drop and/or more power dissipation lead to poor circuit performance.

Thus, what is desired is a transistor layout design with low ohmic characteristics.

BRIEF SUMMARY OF THE INVENTION

The present invention is directed to a transistor driver circuit having a low ohmic layout structure and a method of making the same.

In an embodiment of the present invention, the circuit comprises a plurality of transistors, each with source and drain regions formed in a substrate. At least first and second interconnect layers are formed on top of the substrate. A first plurality of contacts connect the source regions to one of the first or second interconnect layers. A second plurality of contacts connect the drain regions to the other of the first or second interconnect layers. The first and second interconnect layers cover a region above the substrate area in which the plurality of transistors reside so as to achieve the low ohmic result. The second interconnect layer has openings therein for one of the respective first or second plurality of contacts to pass therethrough and couple to the at least one first interconnect layer. Either the first or second interconnect layers can function as an input or output for the circuit.

The plurality of transistors can comprise metal oxide semiconductors (MOS) transistors, complementary metal oxide semiconductors (CMOS) transistors, or the like.

The first and second interconnect layers can comprise metal, metal alloy, polysilicon, or the like, and may have slots formed therein to permit out-gassing and the like.

In another embodiment of the present invention, the first and second interconnect layers can each comprise more than one metal, metal alloy or polysilicon layer.

In still a further embodiment, the first and/or second interconnect layers can cover a substantial portion of the transistor region.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
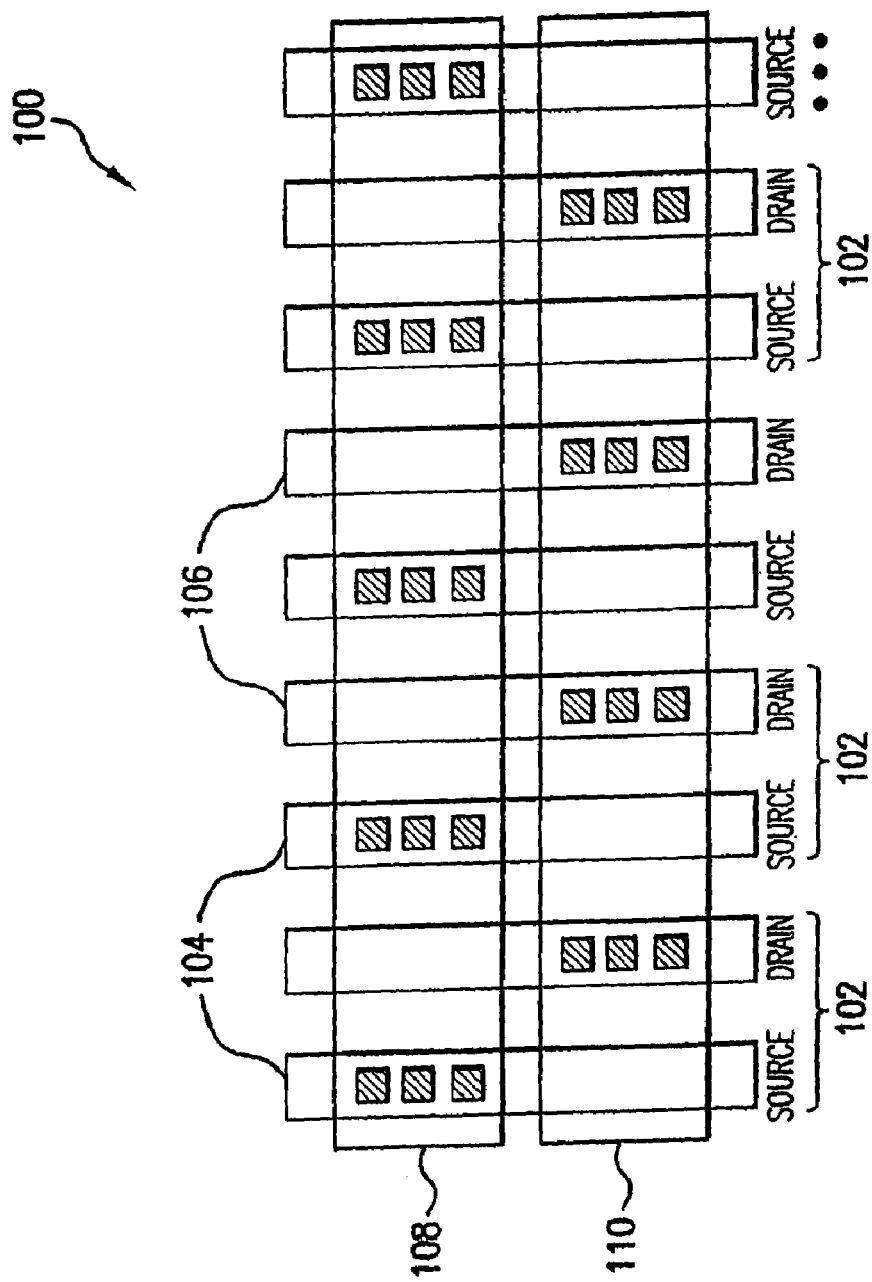
FIG. 1 shows a top view of a conventional technique for interconnecting sources and drains of MOS transistors.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

A contact is an opening that allows electrical connection between metal and silicon layers. A via is an area that provides an electrical pathway from one metal layer to the metal layer above or below. For example, a via can be an opening in a dielectric layer through which a riser passes, or in which the walls are made conductive. For the purposes of the present invention, the terms contact and via will be used interchangeably.

The interconnects described below comprise a highly conductive material, such as metal, metal alloy (e.g., aluminum and aluminum alloys), doped or undoped polycrystalline silicon (polysilicon), or the like, as would become apparent to a person having ordinary skill in the art.

FIG. 1 shows a top view of a conventional technique for interconnecting sources and drains of MOS transistors. Specifically, FIG. 1 shows a driver transistor 100 comprising a plurality of individual MOS transistors 102. Each transistor 102 comprises a source region 104 and a drain region 106. The gate electrodes of transistors 102 are not shown. The source regions of transistors 102 are interconnected by a metal interconnect 108. Similarly, drain regions 106 of transistors 102 are interconnected by a metal interconnect 110. Even in a multi-interconnect layer structure, the source interconnect 108 and drain interconnect 110 are typically formed using the same interconnect (e.g., metal) layer. Metal interconnects 108 and 110 (also called "strips") are usually at most one half of the width (w) of the transistor 102. A transistor circuit having the structure of the driver transistor of FIG. 1 suffers from poor performance because of a large voltage drop and/or increased power dissipation as described above.

According to the present invention, a layout technique is provided that minimizes parasitic and/or layout resistance of MOS transistors. This results in less voltage drop and less power dissipation across the device and/or interconnects. Moreover, this technique results in better circuit performance due to lower power dissipation thus providing better efficiency.

Specifically, more metal is used for the source and drain interconnects, which enables them to carry more current. With more metal to carry the current, the resistance is reduced, which in turn reduces the voltage drop and power dissipation of the circuit.

According to an embodiment of the present invention, the circuit comprises a plurality of transistors. Each transistor has a source and drain region formed in a substrate. A plurality of interconnect layers are formed above the substrate. A first plurality of contacts are used to interconnect the source regions to at least one of the interconnect layers. A second plurality of contacts are used to interconnect the drain regions and connect them to at least one of the other interconnect layers. The interconnect layer used to contact the source regions covers a larger area above the substrate than the conventional interconnect strips 108/110 shown in FIG. 1. Similarly, the second interconnect layer connected to the drain regions also covers a large region of the substrate above the transistors. Since these interconnect layers are stacked above the substrate, the lower at least one interconnect layer has openings therein for the plurality of contacts of the upper at least one interconnect layer to contact the respective regions in the substrate.

Typically, the first interconnect layer connecting the source regions functions as an input for the transistor, and the interconnect layer connecting the drain regions functions as an output for the driver circuit. Of course, these functions can be reversed, as would be apparent to a person having ordinary skill in the art.

Figure 2:
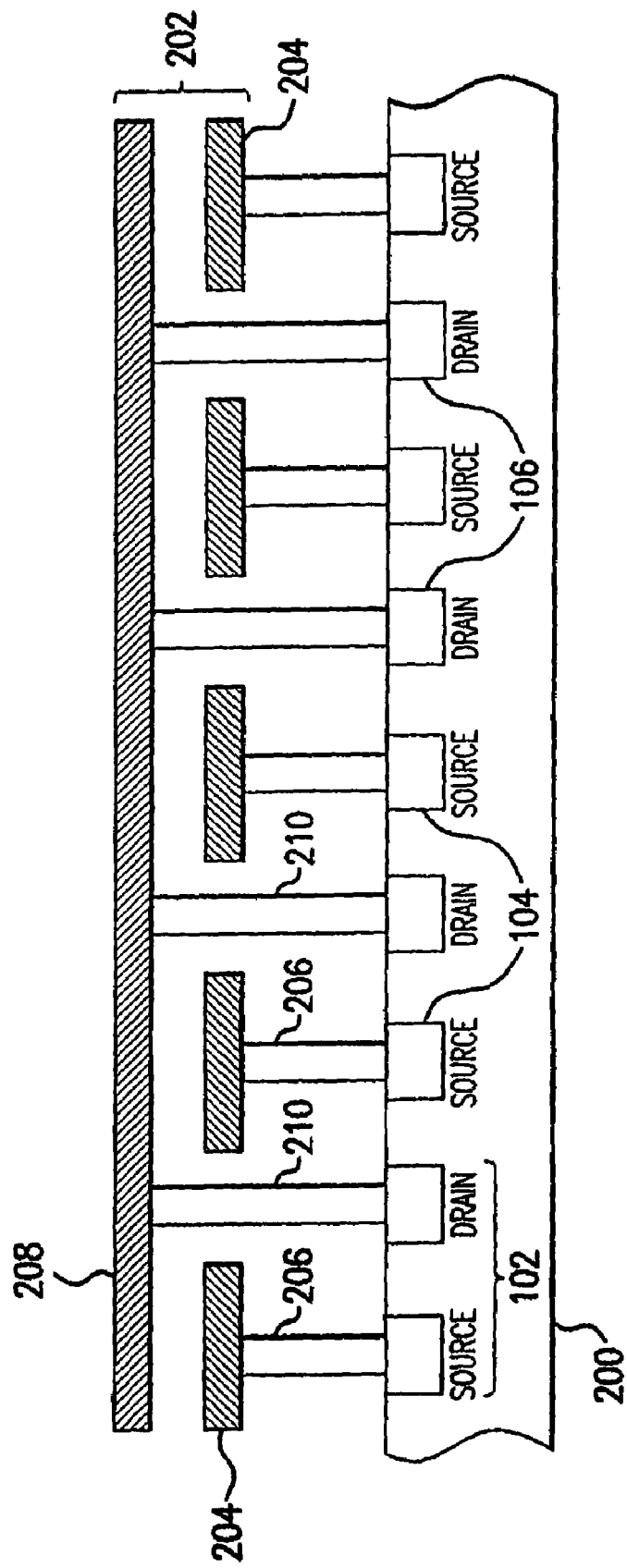
FIG. 2 shows a cross section of a circuit according to an embodiment of the present invention.

FIG. 2 shows a cross section of a circuit according to the present invention. Substrate 200 comprises transistors 102 having source regions 104 and drain regions 106. The circuit comprises a plurality of interconnect layers 202. Interconnect layers 202 can comprise two or more interconnect layers. In one embodiment, a first interconnect layer 204 is used to interconnect the source regions 104 using a first plurality of contacts (also referred to as "vias") 206. A second interconnect layer 208 is used to interconnect the drain regions 106 using a second plurality of contacts 210. In this manner the interconnect layers cover more substrate area than conventional interconnects and provide the low ohmic advantages as described above.

Figure 3:
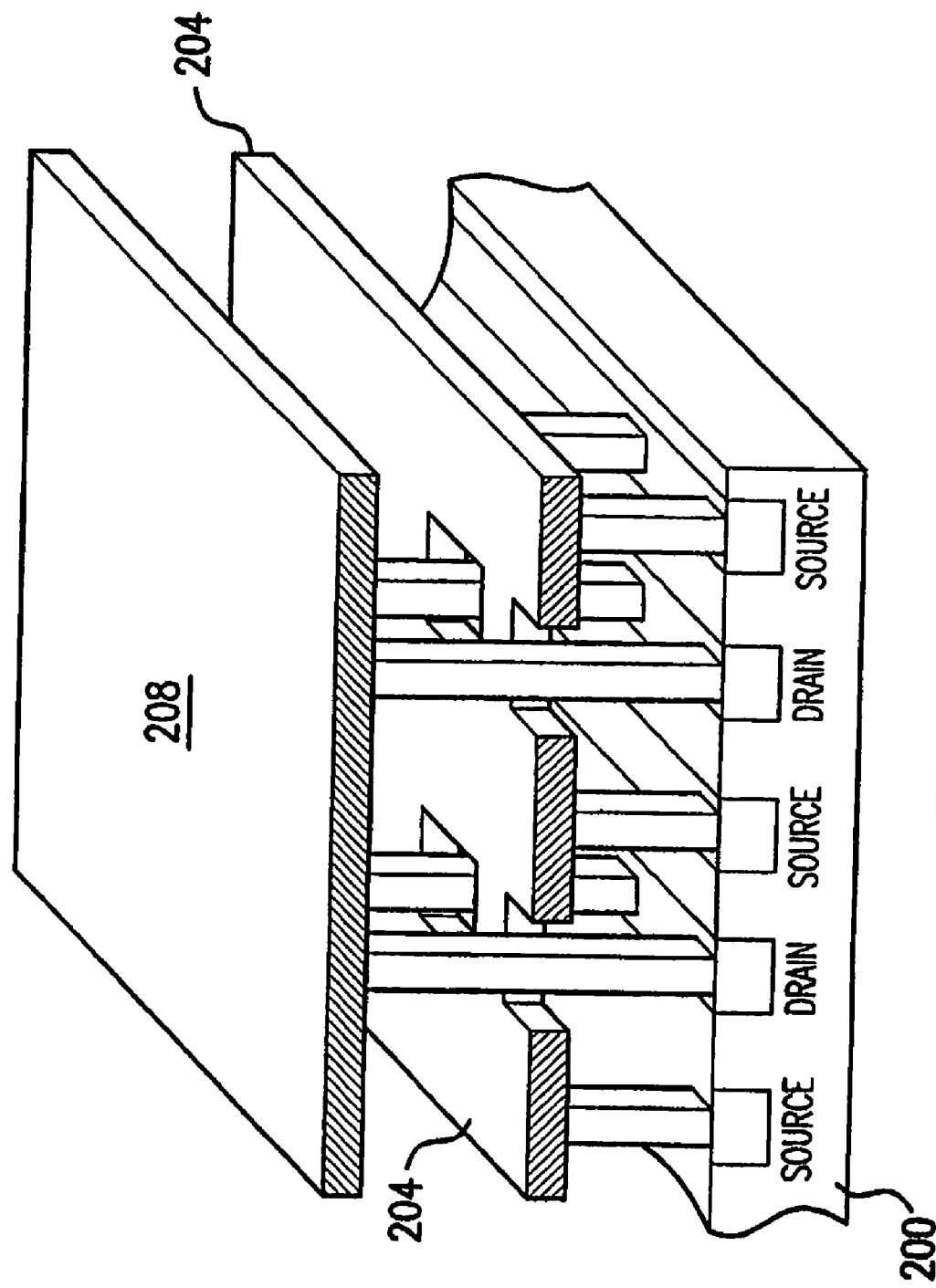
FIG. 3 shows a three-dimensional rendering of circuit in connection with the embodiment of FIG. 2.

FIG. 3 shows a three-dimensional rendering of a circuit in connection with the embodiment of FIG. 2.

Figure 4:
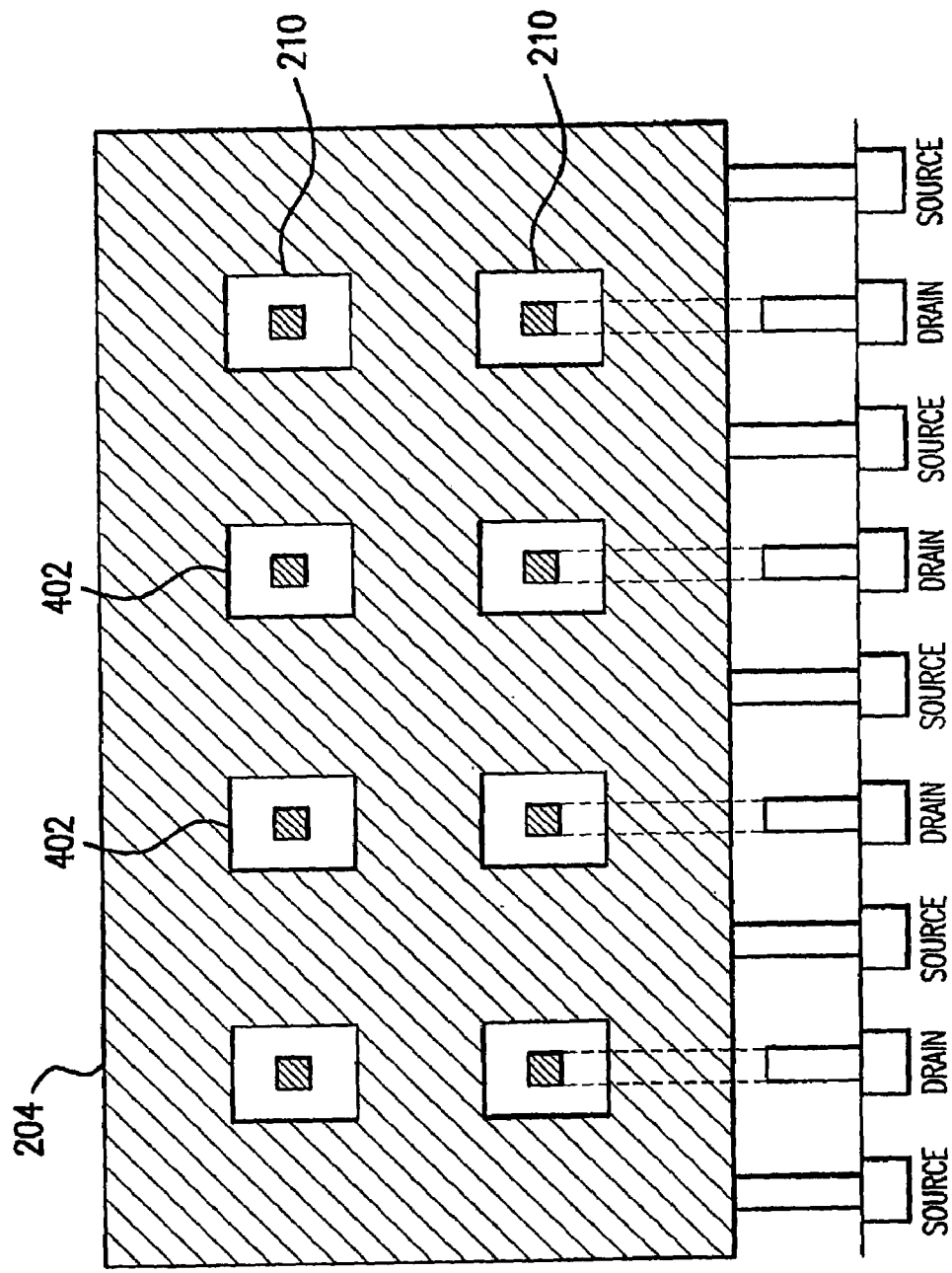
FIG. 4 is a top view of the first interconnect layer 204.

FIG. 4 is a top view of the first interconnect layer 204. Interconnect layer 204 includes openings or holes 402 for permitting the second plurality of contacts 210 to pass therethrough. The shape and size of openings 402 will be implementation dependent, as would become apparent to a person having ordinary skill in the art based on the present disclosure.

Figure 5:
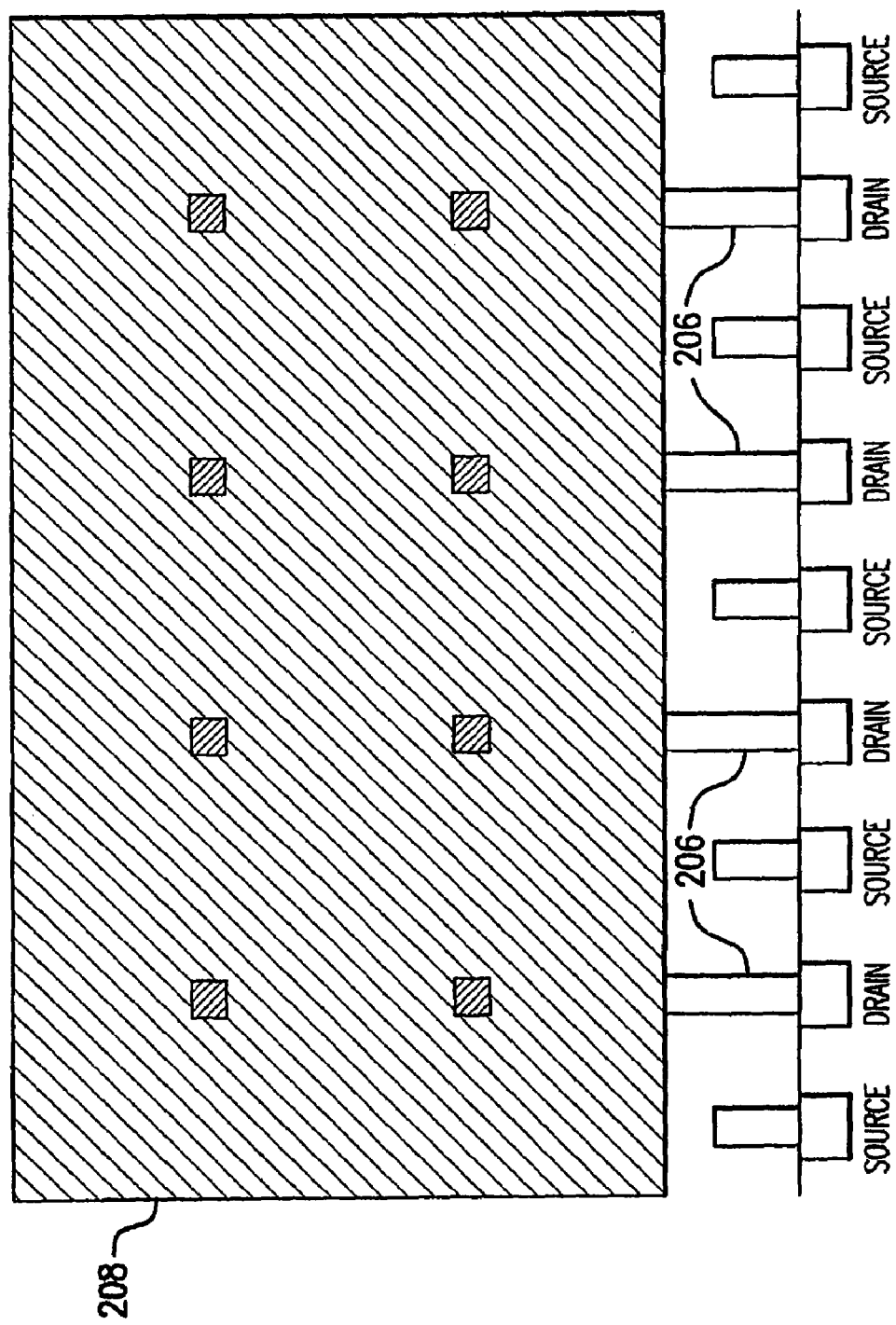
FIG. 5 is a top view of the second interconnect layer 208.

FIG. 5 is a top view of the second interconnect layer 208. The second interconnect layer 208 can comprise a large area conductor. In comparison to the conductive strips (source interconnect 108 and drain interconnect 110) of FIG. 1, the various interconnect layers in connection with the present invention cover a much larger surface area. While the exact amount of surface area covered by the interconnect layers may be implementation specific, interconnect layers according to the present invention approximately cover the surface area of the substrate associated with their corresponding transistor regions. Interconnects, or the like, to electrically connect the interconnect layers of the present invention to other integrated circuit components on-chip or to provide connectivity off-chip are not shown, but their structure and functionality are well known, and thus are not described herein.

Figure 6:
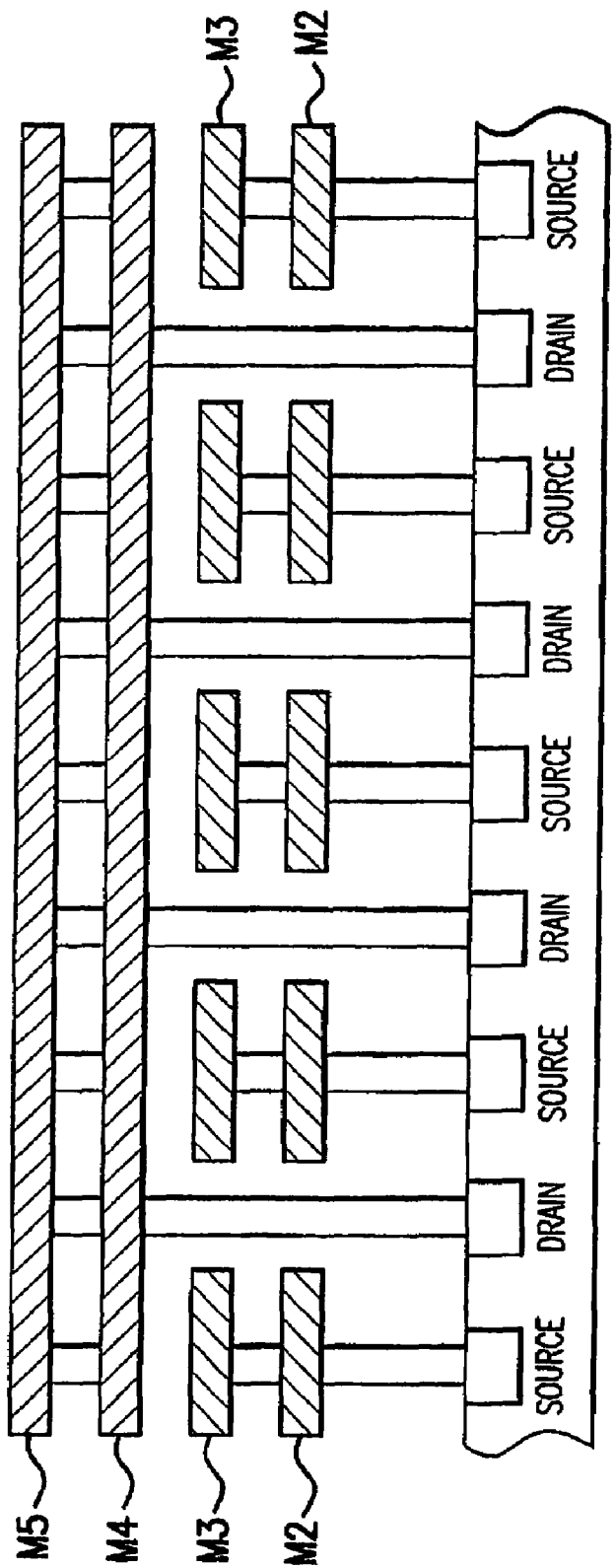
FIG. 6 is a cross-sectional view of another embodiment according to the present invention.

FIG. 6 is a cross-sectional view of another embodiment of the present invention. In this embodiment, the plurality of interconnect layers comprises more than two layers. In this embodiment, the source interconnect layer and the drain interconnect layer each comprise two interconnect layers. In an integrated circuit manufacturing technique comprising a chip having five metal layers, for example, the source interconnect layers may comprise metal layers two and three (M2 and M3), while the drain interconnect layer comprises M4 and M5. Using a plurality of interconnect layers for each of the source and drain structures further minimizes parasitic/layout resistance.

Out-gassing and stress caused by the mechanical deformation, etc., of interconnects can cause "buckling" or layer separation. In order to solve the problem of stress and trapped gases, chip designers use software tools to create slots or open slits in interconnects on a circuit chip during layout time, as would become apparent to a person having ordinary skill in the art. These problems and solutions are foundry and process dependant. Such slotting techniques can be employed in connection with the present invention, but are not necessary to practice the invention.

Manufacturing

A exemplary method for making the above-described circuit according to the present invention will now be described.

The method comprises forming a plurality of transistors having source and drain regions in a substrate. After further and/or optional subsequent processing of the substrate, the interconnect (e.g., metal) layers and contact vias are formed according to known semiconductor processing techniques, such as lithography, etching, metallization, and the like.

However, in connection with the present invention, lithography techniques, etc., are used to form the interconnect layers above the substrate in a manner wherein the interconnect layers cover a region above the substrate area in which the plurality of transistors reside, rather than in conventional strips as described in connection with FIG. 1.

Moreover, all but the top interconnect layer can be formed with openings therein for contacts to pass therethrough, which permit further interconnect layers formed thereon to contact their respective transistor regions in the substrate.

Intermediate processing of the interconnect layers can include the step(s) of forming slots therein to avoid deformation, as described above.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A circuit, comprising:
   (a) a plurality of transistors disposed in a substrate, each with a source region and a drain region;
   (b) a first interconnect layer disposed above the substrate;
   (c) a second interconnect layer disposed between the first interconnect layer and the substrate;
   (d) a first plurality of contacts between the source regions and one of the first or second interconnect layers; and
   (e) a second plurality of contacts coupling the drain regions to the other of the first or second interconnect layers,
   wherein the second interconnect layer has openings therein for one of the respective first or second plurality of contacts to pass therethrough and couple to the first interconnect layer.

2. The circuit of claim 1, further comprising slots in the first interconnect layer.

3. The circuit of claim 1, further comprising slots in the second interconnect layer.

4. The circuit of claim 1, further comprising an input coupled to the first interconnect layer and an output coupled to the second interconnect layer.

5. The circuit of claim 1, further comprising an input coupled to the second interconnect layer and an output coupled to the first interconnect layer.

6. The circuit of claim 1, wherein the plurality of transistors comprise metal oxide semiconductors transistors.

7. The circuit of claim 1, wherein the plurality of transistors comprise complementary metal oxide semiconductors transistors.

8. The circuit of claim 1, wherein the first and second interconnect layers comprise at least one of metal, metal alloy and polycrystalline silicon.

9. The circuit of claim 1, wherein the first interconnect layer is connected to at least one further metal, metal alloy or polysilicon layer.

10. The circuit of claim 1, wherein the second interconnect layer is connected to at least one further metal, metal alloy or polysilicon layer.

11. The circuit of claim 1, wherein the first interconnect layer covers a substantial portion of the source and drain regions.

12. The circuit of claim 1, wherein the second interconnect layer covers a substantial portion of the source and drain regions.

* * * * *